United States Patent
Lin et al.

(10) Patent No.: US 10,990,741 B2
(45) Date of Patent: *Apr. 27, 2021

(54) MULTIPLE PATTERNING METHOD AND SYSTEM FOR IMPLEMENTING THE METHOD

(71) Applicant: TAIWAN SEMICONDUCTOR MANUFACTURING COMPANY, LTD., Hsinchu (TW)

(72) Inventors: Yen-Hung Lin, Hsinchu (TW); Chung-Hsing Wang, Hsinchu County (TW); Yuan-Te Hou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,822

(22) Filed: Nov. 7, 2019

(65) Prior Publication Data
US 2020/0074038 A1 Mar. 5, 2020

Related U.S. Application Data

(63) Continuation of application No. 15/259,559, filed on Sep. 8, 2016, now Pat. No. 10,489,547.

(51) Int. Cl.
*G06F 30/30* (2020.01)
*G06F 30/392* (2020.01)
*G06F 30/394* (2020.01)

(52) U.S. Cl.
CPC .......... *G06F 30/392* (2020.01); *G06F 30/394* (2020.01)

(58) Field of Classification Search
CPC .................. G06F 17/5072; G06F 17/5077
(Continued)

(56) References Cited

U.S. PATENT DOCUMENTS 8,601,416 B2   12/2013   Kuo et al.
8,709,684 B2 *  4/2014   Chern ................. G03F 7/70466
                                                        430/5
(Continued)

FOREIGN PATENT DOCUMENTS

TW          201244824          11/2012

OTHER PUBLICATIONS

Office Action dated May 7, 2020 from corresponding application No. TW 105141880.

*Primary Examiner* — Jack Chiang
*Assistant Examiner* — Brandon Bowers
(74) *Attorney, Agent, or Firm* — Hauptman Ham, LLP

(57) ABSTRACT

A method includes assigning a first color group to a first routing track of the layout. The method further includes assigning a second color group to a second routing track of the layout. The method includes assigning the first color group to a third routing track of the layout, wherein the second routing track is between the first routing track and the third routing track. The method further includes assigning a first color from the first color group to a first conductive element along the first routing track. The method further includes assigning a second color from the first color group to a second conductive element along the first routing track. The method further includes assigning a third color from the second color group to a third conductive element on the second routing track, wherein the third color is different from each of the first color and the second color.

20 Claims, 6 Drawing Sheets

(58) Field of Classification Search
USPC .......................................................... 716/55
See application file for complete search history.

(56) References Cited

U.S. PATENT DOCUMENTS

| | | |
|---|---|---|
| 8,762,900 B2 | 6/2014 | Shin et al. |
| 8,775,993 B2 | 7/2014 | Huang et al. |
| 8,782,570 B1 * | 7/2014 | Li .......................... G06F 30/00 |
| | | 716/52 |
| 8,887,116 B2 | 11/2014 | Ho et al. |
| 8,935,639 B1 * | 1/2015 | Tzeng ................... G06F 30/394 |
| | | 716/55 |
| 8,943,445 B2 | 1/2015 | Chen et al. |
| 8,990,762 B2 | 3/2015 | Yuh et al. |
| 9,081,933 B2 | 7/2015 | Liu et al. |
| 9,183,341 B2 | 11/2015 | Chen et al. |
| 9,213,790 B2 | 12/2015 | Hsu et al. |
| 2014/0237435 A1 | 8/2014 | Chen et al. |
| 2014/0304670 A1 | 10/2014 | Su et al. |
| 2015/0278419 A1 | 10/2015 | Yang et al. |
| 2015/0370937 A1 | 12/2015 | Liu et al. |
| 2015/0370945 A1 | 12/2015 | Lee |
| 2018/0315723 A1 * | 11/2018 | Singh ...................... H01L 24/03 |
| 2018/0321581 A1 * | 11/2018 | Chou ................. H01L 21/0338 |

* cited by examiner

MULTIPLE PATTERNING METHOD AND SYSTEM FOR IMPLEMENTING THE METHOD

PRIORITY CLAIM

The present application is a continuation of U.S. application Ser. No. 15/259,559, filed Sep. 8, 2016, which is incorporated herein by reference in its entirety.

BACKGROUND

In semiconductor fabrication processes, when features in a single layer of a semiconductor device are positioned closer than patterning resolution permits, multiple masks are often used in order to pattern the features. The features of the single layer of the semiconductor device are separated into different masks so that each mask includes features which are separated by a distance equal to or greater than a patterning resolution parameter. The process is called n-patterning based on the number of masks used to form the layer. For example, in some instances, a process using two masks is called double patterning; while a process using four masks is called quadruple patterning.

While designing a semiconductor device, designers will lay out the features of the semiconductor device in a layout pattern. These layout patterns include commonly used structures which are stored as standard cells in a cell library. A cell library is a database of standard cells which a designer can use in order to efficiently insert commonly used structures in a layout pattern while avoiding the extra task of designing each structure for each different semiconductor device. In some instances, the cell libraries include rules for placement of elements in order to assist with a coloring process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
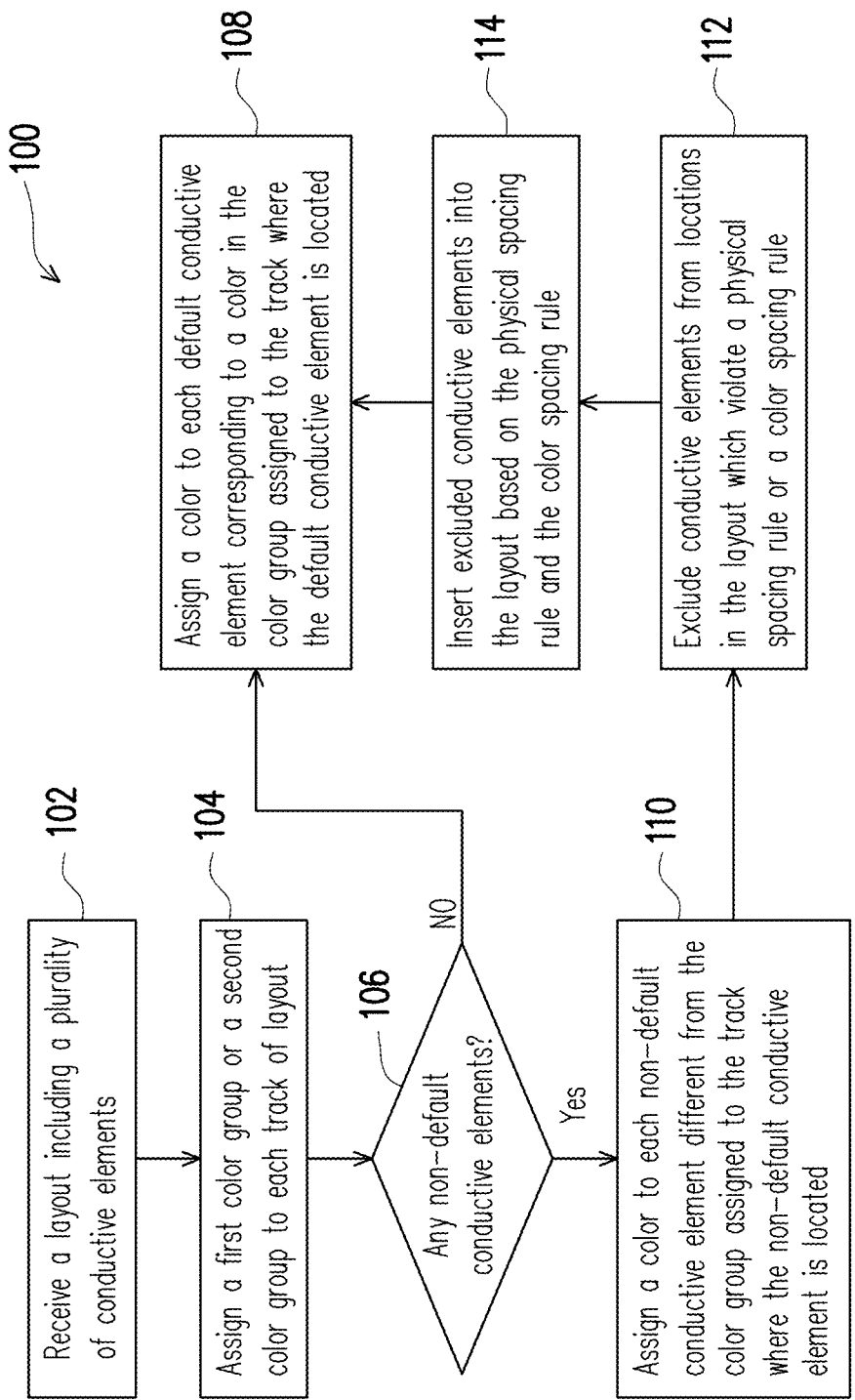
FIG. 1 is a flowchart of a method of coloring a layout in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technology nodes decrease in size, distances between conductive elements decrease. At least two rules are used to determine locations for conductive elements in a layout. A physical spacing rule sets a minimum physical distance between adjacent conductive elements. If the physical spacing rule is violated, then parasitic capacitance or parasitic resistance will prevent the conductive element from performing as designed, in some instances. The physical spacing rule differs depending on a distance from the substrate, i.e., a metal level, of the layer. In some instances, as a distance between the layer and the substrate increases, the physical spacing rule defines a greater distance between conductive elements.

A color spacing rule sets a minimum distance between conductive elements formed on a same mask. Due to manufacturing variation resulting from mask overlay errors, light diffusion during lithography processes and other unavoidable variations, a spacing between conductive elements in a single mask is increased to be greater than the physical spacing rule in order to reliably form the conductive elements in the final device.

In order to reliably form the conductive elements, multiple patterning techniques are developed to form the conductive elements in a same layer using different masks. Segmenting the conductive elements into groups is called coloring. Each conductive element is assigned a specific color which corresponds to a particular mask for use during a manufacturing process. The coloring process often includes: formation of conflict graphs; decomposition of conflict graph using various algorithms; and redesign of a layout in order to comply with coloring requirements. These processes require a significant amount of time to resolve a coloring scheme which will permit the device to function properly while also satisfying both the physical spacing rule and the color spacing rule. In accordance with one or more embodiments, the method and system described in this application avoid the extensive amounts of time and recursive cycles used to test and redesign layouts by imposing specific rules on the coloring process. These rules help to ensure that the layout is capable of being segmented into a coloring scheme.

FIG. 1 is a flowchart of a method 100 of coloring a layout in accordance with some embodiments. In operation 102, a layout is received. The layout includes a plurality of conductive elements. The layout also includes a plurality of routing tracks for a specific level of the device corresponding to the received layout. Routing tracks extend parallel to one another with a predefined spacing between adjacent routing tracks. Conductive elements are positioned along a routing track of the plurality of routing tracks. The conductive elements are part of an interconnect structure for electrically connecting different components of the final device.

The predefined spacing between adjacent routing tracks is equal to or greater than the physical spacing rule for a final device, and equal to or greater than twice the color spacing rule divided by a number of masks for forming the layer. The predefined spacing between adjacent routing tracks satisfies two conditions:

$$Sx \geq p_s; \text{ and} \quad (1)$$

$$Sx \geq 2*c_s/n, \quad (2)$$

where Sx is the spacing between adjacent routing tracks, $p_s$ is a minimal spacing defined by the physical spacing rule, $c_s$ is a minimal spacing defined by the color spacing rule, and n is the number of masks used for forming the layer. For example, quadruple patterning would have a value of n=4. In some embodiments, the minimal spacing defined by the physical spacing rule is increased to account for misalignment due to manufacturing variation. In some embodiments, the increase in the physical spacing rule is defined by a circuit designer. In some embodiments, the increase in the physical spacing rule is determined based on empirical data collected related to the manufacturing process for creating and utilizing masks created using method 100.

Conductive elements along each routing track also have a minimum spacing requirement. A distance between adjacent conductive elements along each routing track is greater than or equal to the physical spacing rule. Additionally, a distance between conductive elements having a same color along each routing track is equal to or greater than the color spacing rule. A number of conductive elements along a routing track between any given conductive element and a closest conductive element having the same color depends on the number of masks used to form the layer of the final device. For example, in a quadruple patterning process, one conductive element will be between conductive elements along the routing track having the same color.

In some embodiments, the conductive elements are vias for providing electrical connection in a direction perpendicular to a top surface of a substrate of the final device. In some embodiments, the conductive elements are lines for providing electrical connection in a direction parallel to the top surface of the substrate of the final device. In some embodiments, all of the conductive elements have a default shape, and are called default conductive elements. The default shape is a standard shape for the conductive element, such as a square, a circle or another suitable shape. In some embodiments, at least one conductive element has a non-default shape, and is called a non-default conductive element. The non-default shape is a shape different from the default shape. A dimension of the non-default conductive element in a direction perpendicular to the routing tracks is greater than a dimension of the default conductive element in the direction perpendicular to the routing tracks. In some embodiments, the non-default shape includes a slot via.

In some embodiments, the layout is provided by the circuit designer through an input/output (I/O) interface of a system for performing method 100. In some embodiments, the layout is generated on a same system as that used to perform method 100. In some embodiments, the layout is received from a separate system from that for performing method 100. In some embodiments, the layout is received from a cell library. The cell library is configured to store standard cells for use in designing a layout for a device.

In operation 104, a first color group or a second color group is assigned to each track of the layout. The first color group is a set of distinct colors, i.e., no colors within the group are the same. The second color group is also a set of distinct colors. In addition, no colors in the first color group overlap with a color of the second color group. The color group determines the color options for conductive elements located along a specific routing track.

In some embodiments, the first color group and the second color group are assigned by the system for implementing method 100. In some embodiments, the first color group and the second color group are assigned based on instructions from the circuit designer. The color groups are assigned such that no adjacent routing tracks are assigned a same color group.

For example, in a quadruple patterning process, a first color group including colors blue and green is assigned to routing track 0; and a second color group including colors red and orange is assigned to adjacent routing track 1. This assignment is repeated with alternating routing tracks being assigned the first color group, i.e., blue and green, and the second color group, i.e., red and orange.

In some embodiments, additional color groups exist and are assigned to routing tracks of the layout in a cyclical process with the first color group and the second color group.

In operation 106, any non-default conductive elements are identified. In some embodiments, the non-default conductive elements are identified based on an input from the circuit designer. In some embodiments, the non-default conductive elements are identified automatically by the system for implementing method 100.

If the layout is free of non-default conductive elements, method 100 proceeds to operation 108. In operation 108, a color is assigned to each default conductive element based on the assigned color group for the routing track where the conductive element is located. The color for a specific default conductive element is assigned such that adjacent conductive elements have different colors. For example, colors are assigned in an alternating fashion if the color group includes two colors. As discussed above, conductive elements are spaced along each routing track based on the physical spacing rule and the color spacing rule. Therefore, adjustment of the layout is minimized or avoided and the processing time and iterations of the coloring process are reduced in comparison with other coloring techniques.

In comparison with other techniques which include formation of a conflict graph, the coloring process of method 100 is simplified. In addition, colorability of the layout is ensured so long as the distance between adjacent routing tracks and between conductive elements along each routing track satisfies the above conditions. By ensuring colorability, an amount of time for designing the device is reduced because adjustments of the layout are reduced and the circuit designer is able to precisely determine connection paths between components of the device.

If the layout includes non-default conductive elements, method 100 proceeds to operation 110. In operation 110, a color is assigned to each non-default conductive element which is different from the color group assigned to the routing track where the non-default conductive element is located. For example, a non-default conductive element located on a routing track to which the first color group is assigned will receive a color from the second color group. Conversely, a non-default conductive element located on a second color group routing track is assigned a color from the first color group.

The assignment of colors to the non-default conductive elements also complies with color spacing rules. A space between adjacent non-default conductive elements having a same color is greater than or equal to the minimum spacing defined by the color spacing rule. In a situation where non-default conductive elements are located within the minimum spacing defined by the color spacing rule, the non-default conductive elements are assigned different colors. The color for each of the non-default conductive elements is still from the same color group. For example, if two non-default conductive elements are located on a routing track assigned to the second color group and the non-default conductive elements are within the minimum spacing defined by the color spacing rule, one of the non-default conductive elements is assigned a first color from the first color group and the other non-default conductive element is assigned a second color from the first color group. As a number of colors within a color group increases, spacing between adjacent non-default conductive elements is able to be reduced so long as the physical spacing rule is satisfied.

In operation 112, conductive elements are excluded from locations in the layout which would violate the physical spacing rule or the color spacing rule. The exclusion of conductive elements is performed to account for the atypical shape of the non-default conductive elements present in the layout. As detailed above, the distance between adjacent routing tracks is based on the physical spacing rule. The physical spacing rule is determined based on the default conductive element. Therefore, the presence of a non-default conductive element results in a modification of the layout by excluding conductive elements from certain locations.

Excluding conductive elements includes temporarily removing the conductive elements from the layout. In some embodiments, excluding conductive elements includes temporarily removing only default conductive elements. In some embodiments, excluding conductive elements includes temporarily removing at least one non-default conductive element and at least one default conductive element. In some embodiments which do not include conductive elements at exclusion locations, operation 112 is omitted. For example, if the layout is received from a cell library, the layout will already be arranged to satisfy the physical spacing rule and the color spacing rule, in some embodiments. In some embodiments, excluding conductive elements includes excluding conductive elements in different cells from that containing the non-default conductive element. In such a situation, even the standard cell stored in the cell library is modified in order to comply with the physical spacing rule and the color spacing rule, in some embodiments.

Artificially increasing the physical spacing rule to account for the shape of non-default conductive elements is possible; however, such a modification will increase a size of the final device due to increasing the distance between adjacent routing tracks. As an alternative to increasing the physical spacing rule, excluding conductive elements from certain locations helps to maintain a smaller device while also reducing or avoid violations of the physical spacing rule and the color spacing rule.

In some embodiments, excluding the conductive elements is performed automatically by the system. In some embodiments, excluding the conductive elements is performed based on input from the circuit designer. Additional details with respect to excluding the conductive elements are discussed below with respect to FIG. 2.

In operation 114, the excluded conductive elements are inserted into the layout based on the physical spacing rule and the color spacing rule. Excluding conductive elements in operation 112 includes removing conductive elements from the layout. However, the excluded conductive elements are used to provide electrical connection between components of the device; so the removed conductive elements are re-inserted into the layout at appropriate locations. The appropriate locations satisfy the physical spacing rule and the color spacing rule. In some embodiments, inserting the excluded conductive elements is performed automatically by the system. In some embodiments, inserting the excluded conductive elements is performed based on input from the circuit designer.

In some embodiments where operation 112 is omitted, operation 114 is also omitted. If no conductive elements are excluded, then insertion of the excluded conductive elements is unnecessary, in some embodiments.

Following operation 114, method 100 proceeds to operation 108 in which the colors are assigned to default conductive elements. The non-default conductive elements retain the color assigned in operation 110. Utilizing the coloring scheme of operation 110 helps to reduce a size of the final device in comparison with a process which assigns colors to non-default conductive element which matches the color group of the routing track.

The shape of the non-default conductive element prevents placement of a conductive element in the routing track adjacent to the non-default conductive element in a location aligned with the non-default conductive element. The physical spacing rule which is used to define the distance between the adjacent routing tracks is based on dimensions of default conductive elements. Placing a conductive element in an adjacent routing track in and aligned with a non-default conductive element would therefore violate the physical spacing rule.

The shape of the non-default conductive element also prevents placement of a conductive element in a closest routing track of the same color as the non-default conductive element in a location aligned with the non-default conductive element. The color spacing rule which is used to define the distance between the adjacent routing tracks is based on dimensions of default conductive elements. Placing a conductive element in the closest routing track of the same color and aligned with a non-default conductive element would therefore violate the color spacing rule.

If the color of the non-default conductive element remained one of the colors of the color group assigned to the routing track, then the exclusion area would cover multiple routing tracks on each side of the non-default via. For example, in a quadruple patterning process, the color groups are assigned to routing tracks in alternating fashion. As a result, the exclusion area would include the adjacent routing track based on the physical spacing rule; and would include the second routing track based on the color spacing rule. The second routing track would be assigned a same color group as the routing track of the non-default via, due to the alternating assignment of color groups. The increased dimension of the non-default conductive element would reduce a distance between the non-default conductive element and a conductive element on the second routing track aligned with the non-default conductive element to be less than the minimum spacing of the color spacing rule. However, by changing the color of the non-default conductive element to be a color of a different color group from the routing track, excluding of conductive elements on the second routing track is avoided. Explained differently, for the purposes of the non-default conductive element, the physical spacing rule and the color spacing rule exclude only the adjacent routing track. This makes the second routing track available for receiving conductive elements, which helps to facilitate a reduction in the size of the final device in comparison with a technique that does not include operation 110.

In some embodiments, method 100 includes additional operations, such as generating instructions for forming a plurality of masks based on the coloring of the default conductive elements and non-default conductive elements. The masks are usable for forming a final device through a semiconductor manufacturing process. In some embodiments, the layout resulting from method 100 is saved in a cell library for later use in another portion of the device or for use in another device. In some embodiments, an order of operations of method 100 is changed. For example, in some embodiments, operation 112 is performed prior to operation 110. In some embodiments, at least one operation is performed simultaneously with another operation. For example, in some embodiments, operation 112 is performed simultaneously with operation 114.

Figure 2:
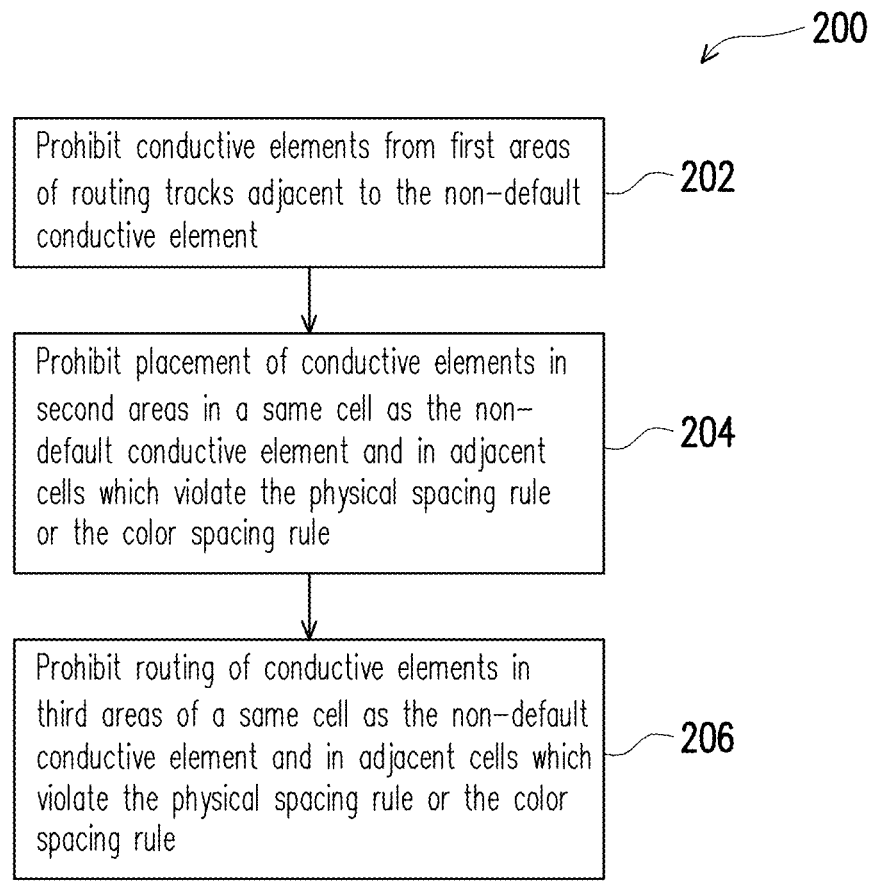
FIG. 2 is a method of using electronic design assistance (EDA) tools to design a colored layout in accordance with some embodiments.

FIG. 2 is a method 200 of using electronic design assistance (EDA) tools to design a colored layout. Method 200 is an implementation of operation 112 of method 100 (FIG. 1) in some embodiments. In operation 202, conductive elements are prohibited in first areas of routing tracks adjacent to the non-default conductive element. The conductive elements in the first areas of the adjacent routing tracks are prohibited based on the physical spacing rule. The conductive elements are prohibited in first areas of the adjacent routing tracks which are less than the minimum distance defined by the physical spacing rule from the non-default conductive element. Portions of the adjacent routing tracks which are greater than or equal to the minimum distance defined by the physical spacing rule from the non-default conductive element remain eligible for receiving conductive elements.

In some embodiments, an automatic placement and routing (APR) tool is used to define the first areas for prohibiting conductive elements. The APR tool is capable of performing design rule checking (DRC) in order to determine whether the physical spacing rule and the color spacing rule are satisfied by the conductive elements within the layout. In some embodiments, the circuit designer defines at least one first area for prohibiting conductive elements. In some embodiments, the APR tool provides a recommendation for first prohibition areas to the circuit designer for approval or modification.

In some embodiments, the layout including the first prohibition areas is saved in a cell library as part of a standard cell. Including the layout in a standard cell in a cell library reduces processing time during design of the device because the prohibition area already exists when the standard cell is inserted into the layout.

In operation 204, conductive elements in second areas are prohibited based on the physical spacing rule and the color spacing rule. The second areas are located in either the same cell as the non-default conductive element or in cells adjacent to the non-default conductive element. For example, if a non-default conductive element is located near a boundary of a cell, the dimensions of the non-default conductive element will result in a rule violation for conductive elements in certain portions of an adjacent cell. These portions of the adjacent cell are included in the second areas of operation 204.

In some embodiments, at least one second area overlaps with at least one first area. In some embodiments, every second area is distinct from every first area. In some embodiments, at least one second area is located on a same routing track as the non-default conductive element. In some embodiments, every second area is located on a routing track adjacent to the non-default conductive element.

In some embodiments, an APR tool is used to define the second areas for prohibiting conductive elements. In some embodiments, the APR tool utilized in operation 202 is the same APR tool as that utilized in operation 204. In some embodiments, the APR tool utilized in operation 202 is different from the APR tool as that utilized in operation 204. In some embodiments, the circuit designer defines at least one second area for prohibiting conductive elements. In some embodiments, the APR tool provides a recommendation for second prohibition areas to the circuit designer for approval or modification.

In some embodiments, the second areas are identified after insertion of the cell containing the non-default conductive element and the adjacent cells are inserted into the layout. In some embodiments, the cell containing the non-default conductive element is stored in the cell library including instructions for identifying the second areas during formation of the layout. A cell stored with instructions for identifying the second areas helps to reduce layout design and revision processes.

In operation 206, conductive elements in third areas are prohibited based on the physical spacing rule and the color spacing rule. The third areas are located in either the same cell as the non-default conductive element or in cells adjacent to the non-default conductive element, similar to the second areas.

In some embodiments, at least one third area overlaps with at least one first area or at least one second area. In some embodiments, every third area is distinct from every first area and from every second area. In some embodiments, at least one third area is located on a same routing track as the non-default conductive element. In some embodiments, every third area is located on a routing track adjacent to the non-default conductive element.

In some embodiments, an APR tool is used to define the third areas for prohibiting conductive elements. In some embodiments, the APR tool utilized in operation 206 is the same APR tool as that utilized in operation 202 or operation 204. In some embodiments, the APR tool utilized in operation 206 is different from the APR tool that utilized in operation 202 and operation 204. In some embodiments, the circuit designer defines at least one third area for prohibiting conductive elements. In some embodiments, the APR tool provides a recommendation for third prohibition areas to the circuit designer for approval or modification.

In some embodiments, the third areas are identified after insertion of the cell containing the non-default conductive element and the adjacent cells are inserted into the layout. In some embodiments, the cell containing the non-default conductive element is stored in the cell library including instructions for identifying the third areas during formation of the layout.

In some embodiments, method 200 includes additional operations, such as generating instructions for forming a plurality of masks based on the coloring of the default conductive elements and non-default conductive elements. In some embodiments, the layout resulting from method 200 is saved in a cell library for later use in another portion of the device or for use in another device. In some embodiments, an order of operations of method 200 is changed. For example, in some embodiments, operation 204 is performed prior to operation 202. In some embodiments, at least one operation is performed simultaneously with another operation. For example, in some embodiments, operation 204 is performed simultaneously with operation 206.

Figure 3:
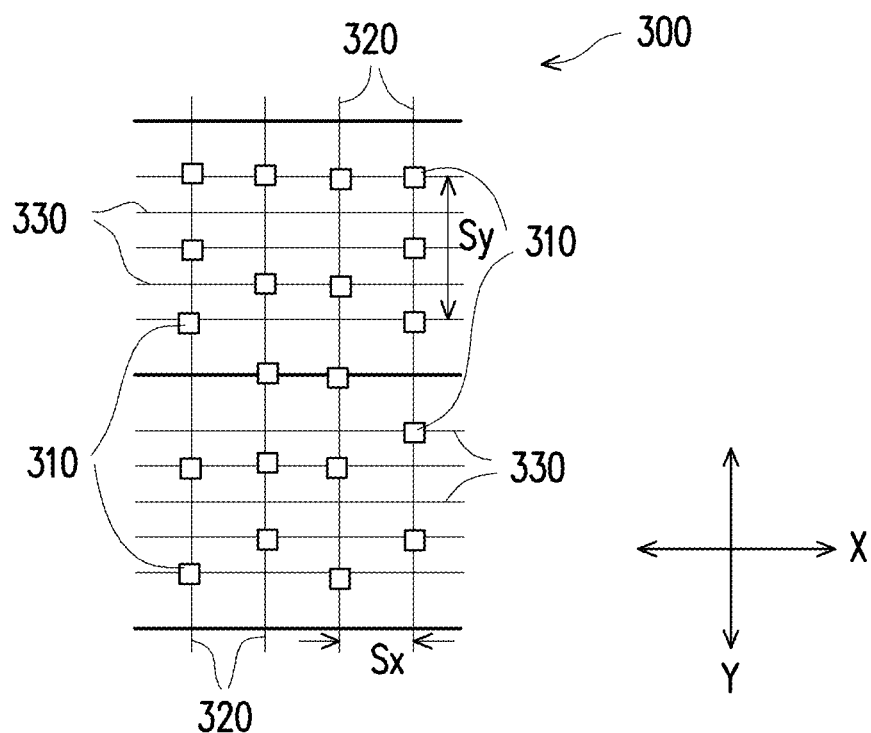
FIG. 3 is a plan view of a layout of conductive elements for an integrated circuit in accordance with some embodiments.

FIG. 3 is a plan view of a layout 300 of conductive elements 310 for an integrated circuit in accordance with some embodiments. In some embodiments, the layout received in operation 102 of method 100 (FIG. 1) is similar to layout 300. Layout 300 includes a plurality of conductive elements 310 arranged in a two-dimensional array. Each conductive element 310 is positioned along a routing track 320. Routing tracks 320 extend along a first direction, i.e., an X-axis. Routing tracks 330 extend in a direction perpendicular to routing tracks 320, i.e., a Y-axis. Routing tracks 330 indicate a location of routing tracks for a layer above or below layout 300. Routing tracks 330 are not part of the layer for layout 300. Conductive elements 310 are located at select intersections of routing tracks 320 and routing tracks 330 to provide electrical connection between components above the layer of layout 300 and components below the layer of layout 300.

A predefined spacing Sx between adjacent routing tracks 320 is based on a physical spacing rule and a color spacing rule for layout 300. Predefined spacing Sx between adjacent routing tracks is equal to or greater than the physical spacing rule for a final device; and equal to or greater than twice the color spacing rule divided by a number of masks for forming the layer, similar to the predefined spacing described above. A predefined spacing Sy between conductive elements 310 along a same routing track 320 is defined based on the physical spacing rule and the color spacing rule similar to the predefined spacing described above.

Conductive elements 310 are all default conductive elements. Conductive elements 310 have a square cross-section. In some embodiments, conductive elements 310 have a circular cross section or another suitable shape.

Figure 4:
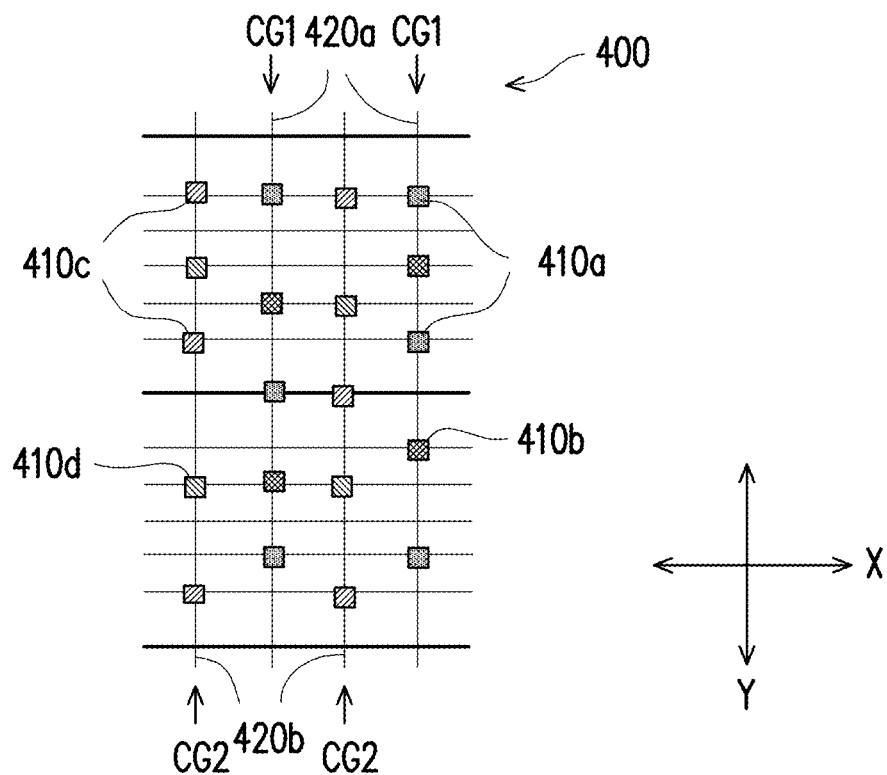
FIG. 4 is a plan view of a colored layout of conductive elements for an integrated circuit in accordance with some embodiments.

FIG. 4 is a plan view of a colored layout 400 of conductive elements 410 for an integrated circuit in accordance with some embodiments. Layout 400 is an example of a result of operation 108 of method 100 (FIG. 1) performed on layout 300 (FIG. 3). Layout 400 includes elements 410a, 410b, 410c and 410d, collectively referred to as conductive elements 410. Layout 400 includes routing tracks 420a and 420b, collectively referred to as routing tracks 420. A color group CG1 or CG2 is assigned to each routing track 420. Color group CG1 is assigned to routing tracks 420a. Color group CG2 is assigned to routing tracks 420b. In some embodiments, layout 400 includes more than two color groups assigned to routing tracks 420. Color group CG1 and color group CG2 are assigned such that routing tracks 420a alternate with routing tracks 420b in a repeating pattern.

Conductive elements 410a are along a same routing track 420a as conductive elements 410b. Conductive elements 410a have a first color of color group CG1. Conductive elements 410b have a second color of color group CG1. Adjacent conductive elements 410a are separated from each other by at least a minimum spacing distance defined by the color spacing rule. A similar spacing arrangement exists for adjacent conductive elements 410b. Conductive elements 410a are separated from a closest conductive element 410b by at least a minimum spacing distance defined by the physical spacing rule. Conductive elements 410a are arranged in an alternating pattern with conductive elements 410b.

Conductive elements 410c are along a same routing track 420b as conductive elements 410d. Conductive elements 410c have a first color of color group CG2. Conductive elements 410d have a second color of color group CG2. Conductive elements 410c and conductive elements 410d have a similar arrangement as that described above with respect to conductive elements 410a and conductive elements 410b.

Layout 400 is an example of quadruple patterning because four total colors are used, one color for each mask usable to form a device corresponding to the layout. In some embodiments layout 400 is stored in a cell library for use as a standard cell during designing of a device. In some embodiments, the coloring arrangement of layout 400 is usable to generate instructions for forming masks for use in a semiconductor manufacturing process in order to create a device.

Figure 5:
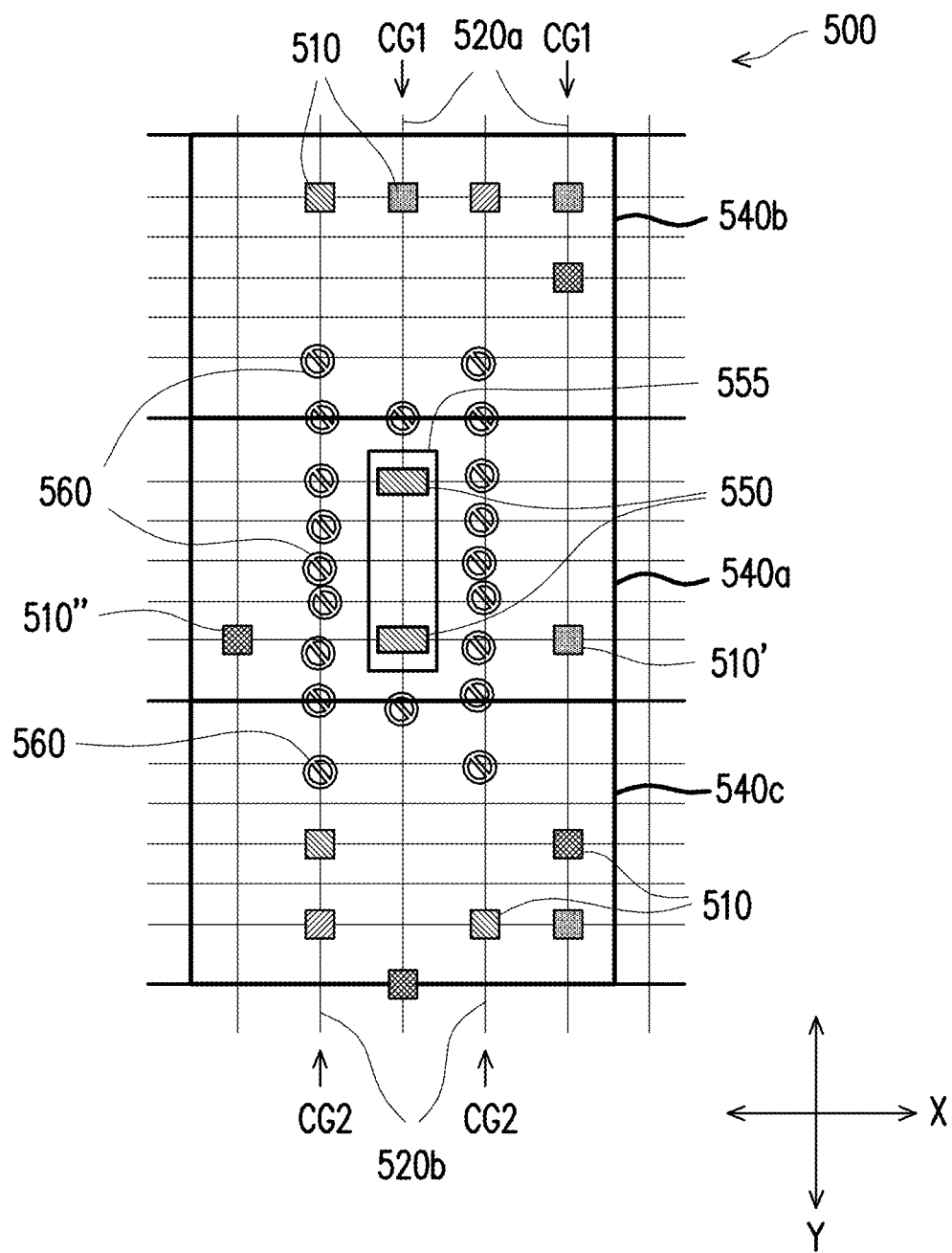
FIG. 5 is a plan view of a layout of conductive elements for an integrated circuit including exclusion sites in accordance with some embodiments.

FIG. 5 is a plan view of a layout 500 of conductive elements 510 and 550 for an integrated circuit including exclusion sites 560 in accordance with some embodiments. In some embodiments, the layout received in operation 102 of method 100 (FIG. 1) is similar to layout 500. Layout 500 includes default conductive elements 510 and non-default conductive elements 550. Layout 500 also includes a cell 540a containing non-default conductive elements 550 and default conductive elements 310. Cell 540b and cell 540c contain only default conductive elements 510. Layout 500 includes routing tracks 520a and 520b, collectively referred to as routing tracks 520. Non-default conductive element region 555 surrounds non-default conductive elements 550. No default conductive elements 510 are in non-default conductive element region 555. In some embodiments, non-default conductive element region 555 is omitted and at least one default conductive element 510 is located between non-default conductive elements 550. Exclusion sites 560 are potential locations for conductive elements which are prohibited from including conductive elements in layout 500 due to the presence and location of non-default conductive elements 550.

Non-default conductive elements 550 are on routing track 520a which is assigned to a first color group CG1. Non-default conductive elements 550 will be assigned a color from a second color group CG2 instead of a color from a first color group CG1. By assigning non-default conductive elements 550 a color from second color group CG2, exclusion sites 560 are limited to locations which violate the physical spacing rule. This increases an area of cell 540a which is available for inclusion of default conductive elements 510 in comparison with a technique where the exclusion sites include additional routing tracks.

An effect of coloring non-default conductive elements 550 a color outside of first color group CG1 assigned to routing track 520a is illustrated by the inclusion of a default conductive element 510' and a conductive element 510". Similar to the description above, a predefined spacing between routing tracks 520 of layout 500 is based on both the physical spacing rule and the color spacing rule. Default conductive element 510' and default conductive element 510" are aligned with a non-default conductive element 550 along the X-axis of layout 500. Exclusion sites 560 are located between default conductive element 510' and non-default conductive element 550 and between default conductive element 510" and the non-default conductive element 550. Exclusion sites 560 are prohibited from containing conductive elements because of the physical spacing rule. Default conductive element 510' and default conductive element 510" are sufficiently separated from non-default conductive element 550 to satisfy the physical spacing rule. However, default conductive element 510' and default conductive element 510" are sufficiently close to non-default conductive element 550 to potentially violate the color spacing rule. Default conductive element 510' has a first color of first color group CG1; and default conductive element 510" has a second color of first color group CG1. If non-default conductive element 550 is assigned a color from first color group CG1, then either default conductive element 510' or default conductive element 510" would violate the color spacing rule. Violations of color spacing rule are resolved by increasing a size of the layout or redesigning the layout to change locations of conductive elements within the layout, which increases the time for designing the layout. By assigning non-default conductive element 550 a color outside of first color group CG1, both default conductive element 510' and default conductive element 510" satisfy both the color spacing rule and the physical spacing rule and a size of layout 500 is maintained.

Figure 6:
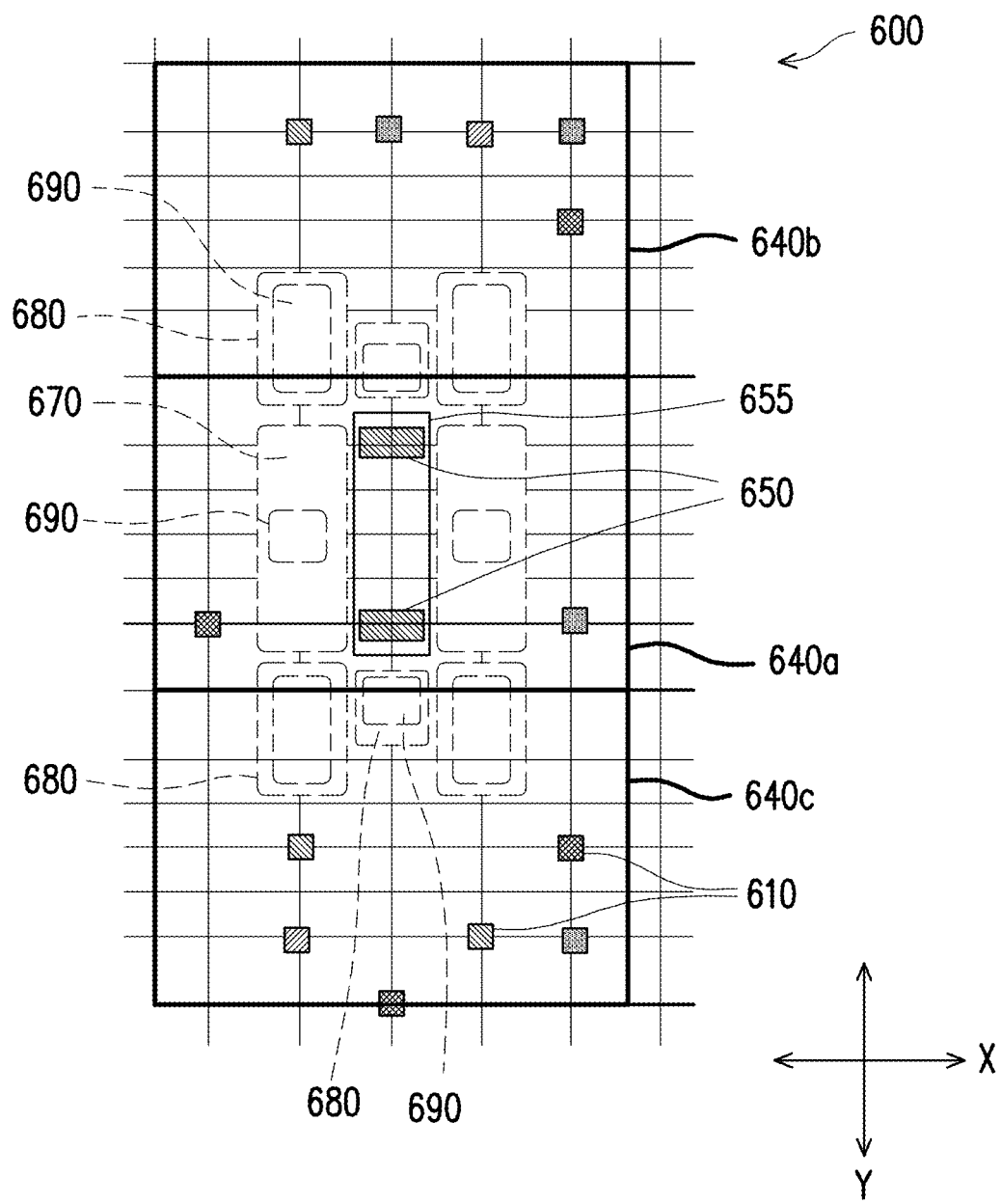
FIG. 6 is a plan view of a layout of conductive elements including for an integrated circuit including exclusion areas in accordance with some embodiments.

FIG. 6 is a plan view of a layout 600 of conductive elements 610 for an integrated circuit including exclusion areas 670-690 in accordance with some embodiments. Layout 600 is similar to layout 500 and similar elements have a same reference number increased by 100. In comparison with layout 500, layout 600 includes exclusion areas 670-690. Exclusion areas 670-690 are locations in layout 600 where conductive elements are prohibited. In some embodiments, exclusion areas 670 are the result of operation 202 of method 200 (FIG. 2). In some embodiments, exclusion areas 680 are the result of operation 204 of method 200. In some embodiments, exclusion areas 690 are the result of operation 206 of method 200.

Exclusion areas 670 are identified based on the physical spacing rule. Conductive elements are prohibited in exclusion areas 670 of the routing tracks which are less than the minimum distance defined by the physical spacing rule from non-default conductive element 650. Portions of the adjacent routing tracks which are greater than or equal to the minimum distance defined by the physical spacing rule from non-default conductive element 650 are outside exclusion areas 670. In some embodiments, exclusion areas 670 are saved with cell 640a in a cell library. By saving exclusion areas 670 in the cell library, designing and color of a layout, e.g., layout 600, consumes less time and resources than a technique which does not include exclusion areas 670 in the cell library.

Exclusion areas 680 are based on the physical spacing rule and the color spacing rule. Exclusion areas 680 are located in cell 640a with non-default conductive element 650 and in cells 640b and 640c. Non-default conductive element 650 is located sufficiently close to a boundary between cell 640a and cell 640b that locations within cell 640b would violate the physical spacing rule or the color spacing rule of layout 600. In some embodiments where cell 640b initially includes conductive elements in exclusion areas 680, the conductive elements of cell 640 within exclusion areas 680 are relocated to a different location within cell 640b. In some embodiments, cell 640a is stored in the cell library with instructions for generating exclusion areas 680.

Exclusion areas 690 are based on the physical spacing rule and the color spacing rule. Similar to exclusion areas 680, exclusion areas 690 are located in cell 640a and in cells 640b and 640c. In some embodiments, conductive elements in cell 640b or cell 640c are relocated based on exclusion areas 690. In some embodiments, cell 640a is stored in the cell library with instructions for generating exclusion areas 690. In comparison with exclusion areas 680, exclusion areas 690 are used to prevent an APR tool from randomly placing conductive elements. Some components of a device have additional specifications, such as delay times for signals. Locations for conductive elements are selected in order to meet these specifications. Conductive elements which are placed in locations for meeting device specifications have a high important. In contrast, conductive elements which do not include these additional specifications have a lower importance. In some instances, where a location of a conductive element is of low importance the APR tool will place the conductive elements in any available location following placement of higher importance conductive elements. In some embodiments, the APR tool places dummy conductive elements, i.e., conductive elements which provide no connectivity to components of the device, in the layout to improve process uniformity. Exclusion areas 690 are used to help prevent conductive elements from being placed in certain locations by the APR tool. In some embodiments, the instructions stored with cell 640a include a rule to prevent the APR tool from placing conductive elements in exclusion areas 690.

Figure 7:
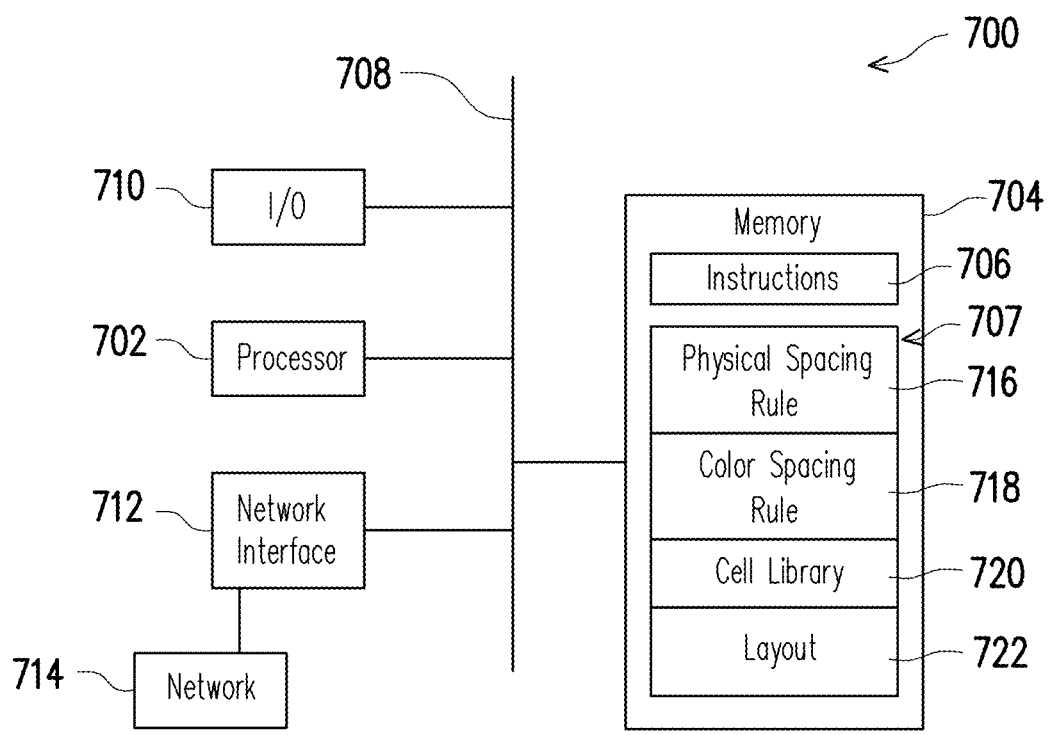
FIG. 7 is a block diagram of a system for implementing a method of coloring a layout in accordance with some embodiments.

FIG. 7 is a block diagram of a system 700 for implementing a method of coloring a layout in accordance with some embodiments. System 700 includes a hardware processor 702 and a non-transitory, computer readable storage medium 704 encoded with, i.e., storing, the computer program code 707, i.e., a set of executable instructions. Computer readable storage medium 704 is also encoded with instructions 706 for interfacing with manufacturing machines for producing a semiconductor device based on the layout. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause system 700 to be usable for performing a portion or all of the operations as described in method 100 or method 200.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is a non-transitory electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 704 stores the computer program code 706 configured to cause system 700 to perform method 100 or method 200. In some embodiments, the storage medium 704 also stores information needed for performing a method 100 or 200 as well as information generated during performing the method 100 or 200, such as a physical spacing rule parameter 716, a color spacing rule parameter 718, a cell library parameter 720, a layout parameter 722, and/or a set of executable instructions to perform the operation of method 100 or 200.

In some embodiments, the storage medium 704 stores instructions 706 for interfacing with manufacturing machines. The instructions 706 enable processor 702 to generate manufacturing instructions readable by the manufacturing machines to effectively implement method 100 or method 200 during a circuit design process of a manufacturing process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 100 or 200 is implemented in two or more systems 700, and information such as physical spacing rules, color spacing rules, cell libraries or a layout are exchanged between different systems 700 via network 714.

System 700 is configured to receive information related to a physical spacing rule through I/O interface 710 or network interface 712. The information is transferred to processor 702 via bus 708 to determine a physical spacing rule for the layout design process. The physical spacing rule is then stored in computer readable medium 704 as physical spacing rule parameter 716. System 700 is configured to receive information related to color spacing rules through I/O interface 710 or network interface 712. The information is stored in computer readable medium 704 as color spacing rule parameter 718. System 700 is configured to receive information related to a cell library through I/O interface 710 or network interface 712. The information is stored in computer readable medium 704 as cell library parameter 720. System 700 is configured to receive information related to a layout through I/O interface 710 or network interface 712. The information is stored in computer readable medium 704 as layout parameter 722.

During operation, processor 702 executes a set of instructions to assign color groups to routing tracks and colors to conductive elements based on the stored parameters 716-722. In some embodiments, system 700 is configured to generate instructions for controlling manufacturing machines for forming masks based on layout parameter 722 as modified during method 100 or method 200.

An aspect of this description relates to a method. The method includes assigning a first color group to a first routing track of the layout. The method further includes assigning a second color group to a second routing track of the layout. The method further includes assigning the first color group to a third routing track of the layout, wherein the second routing track is between the first routing track and the third routing track. The method further includes assigning a first color from the first color group to a first conductive element along the first routing track. The method further includes assigning a second color from the first color group to a second conductive element along the first routing track. The method further includes assigning a third color from the second color group to a third conductive element on the second routing track, wherein the third color is different from each of the first color and the second color. In some embodiments, assigning the first color from the first color group to the first conductive element includes assigning the first color to the first conductive element having a first dimension in a first direction perpendicular to the to the first routing track, and the first dimension is equal to a second dimension of the second conductive element in the first direction. In some embodiments, the method further includes determining whether a fourth conductive element in the layout in the layout has a fourth dimension in the first direction greater than the first dimension. In some embodiments, the method further includes assigning, in response to determining the fourth conductive element has the fourth dimension and the fourth conductive element is on the first routing track, the fourth conductive element a color from the second color group. In some embodiments, the method further includes removing a fifth conductive element having a fifth dimension in the first direction equal to the first dimension from a first location in the layout adjacent the fourth conductive element. In some embodiments, the method further includes inserting the fifth conductive element into the layout at a second location different from the first location. In some embodiments, the method further includes assigning the first color to a fourth conductive element on the first routing track, wherein the second conductive element is between the first conductive element and the fourth conductive element. In some embodiments, the method further includes receiving the layout from a cell library. In some embodiments, the method further includes assigning a fourth color from the second color group to a fourth conductive element on the second routing track, wherein the fourth color is different from each of the first color, the second color and the third color. In some embodiments, the method further includes retrieving a first cell from a cell library; retrieving a second cell from the cell library; and positioning the first cell in the layout adjacent to the second cell so that the first routing track in the first cell is aligned with the first routing track in the second cell. In some embodiments, assigning the first color to the first conductive element includes assigning the first color to the first conductive element located on a boundary of the first cell. In some embodiments, the method includes manufacturing a semiconductor device based on the layout.

An aspect of this description relates to a method. The method includes assigning a first color group to a plurality of first routing tracks of the layout. The method further includes assigning a second color group to a plurality of second routing tracks of the layout, wherein a first routing track of the plurality of first routing tracks is between adjacent second routing tracks of the plurality of second routing tracks, and each color of the second color group is different from each color of the first color group. The method further includes assigning a third color group to a plurality of third routing tracks of the layout, wherein the first routing track of the plurality of first routing tracks is between adjacent third routing tracks of the plurality of third routing tracks, and each color of the third color group is different from each color of the first color group and each color of the second color group. The method further includes assigning a color from the first color group to each default element along each first routing track of the plurality of first routing tracks in a cyclical fashion. The method further includes assigning a color from the second color group to each default element along each second routing track of the plurality of second routing tracks in a cyclical fashion. The method further includes assigning a color from the third color group to each default element along each third routing track of the plurality of third routing tracks in a cyclical fashion. In some embodiments, the method further includes identifying a non-default element in the layout based on a dimension of the non-default element in a first direction perpendicular to each of the plurality of first routing tracks. In some embodiments, the method further includes identifying, in response to identifying the non-default, an exclusion site adjacent to the identified non-default element. In some embodiments, the method further includes moving a default element at the exclusion site to a different position in the layout. In some embodiments, identifying the non-default element includes comparing a dimension of the non-default element in the first direction with a dimension of each default element in the first direction. In some embodiments, the method further includes manufacturing a semiconductor based on the layout.

An aspect of this description relates to a system. The system includes a non-transitory computer readable medium configured to store instructions thereon. The system further includes a processor connected to the non-transitory computer readable medium. The processor is configured to execute the instructions for generating a layout based on cells from a cell library. The processor is further configured to execute the instructions for assigning a first color group to a first routing track of the layout. The processor is further configured to execute the instructions for assigning a second color group to a second routing track of the layout. The processor is further configured to execute the instructions for assigning the first color group to a third routing track of the layout, wherein the second routing track is between the first routing track and the third routing track. The processor is further configured to execute the instructions for assigning a first color from the first color group to a first conductive element along the first routing track. The processor is further configured to execute the instructions for assigning a second color from the first color group to a second conductive element along the first routing track. The processor is further configured to execute the instructions for assigning a third color from the second color group to a third conductive element on the second routing track, wherein the third color is different from each of the first color and the second color. In some embodiments, the processor is configured to execute the instructions for generating instructions for instructing manufacturing machines to manufacture a semiconductor device based on the layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    assigning a first color group to a first routing track of the layout;
    assigning a second color group to a second routing track of the layout;
    assigning the first color group to a third routing track of the layout, wherein the second routing track is between the first routing track and the third routing track;
    assigning a first color from the first color group to a first conductive element along the first routing track;
    assigning a second color from the first color group to a second conductive element along the first routing track; and
    assigning a third color from the second color group to a third conductive element on the second routing track, wherein the third color is different from each of the first color and the second color.

2. The method of claim 1, wherein assigning the first color from the first color group to the first conductive element comprises assigning the first color to the first conductive element having a first dimension in a first direction perpendicular to the to the first routing track, and the first dimension is equal to a second dimension of the second conductive element in the first direction.

3. The method of claim 2, further comprising determining whether a fourth conductive element in the layout in the layout has a fourth dimension in the first direction greater than the first dimension.

4. The method of claim 3, further comprising assigning, in response to determining the fourth conductive element has the fourth dimension and the fourth conductive element is on the first routing track, the fourth conductive element a color from the second color group.

5. The method of claim 4, further comprising removing a fifth conductive element having a fifth dimension in the first direction equal to the first dimension from a first location in the layout adjacent the fourth conductive element.

6. The method of claim 5, further comprising inserting the fifth conductive element into the layout at a second location different from the first location.

7. The method of claim 1, further comprising assigning the first color to a fourth conductive element on the first routing track, wherein the second conductive element is between the first conductive element and the fourth conductive element.

8. The method of claim 1, further comprising receiving the layout from a cell library.

9. The method of claim 1, further comprising assigning a fourth color from the second color group to a fourth conductive element on the second routing track, wherein the fourth color is different from each of the first color, the second color and the third color.

10. The method of claim 1, further comprising:
    retrieving a first cell from a cell library;
    retrieving a second cell from the cell library; and
    positioning the first cell in the layout adjacent to the second cell so that the first routing track in the first cell is aligned with the first routing track in the second cell.

11. The method of claim 10, wherein assigning the first color to the first conductive element comprises assigning the first color to the first conductive element located on a boundary of the first cell.

12. The method of claim 1, further comprising manufacturing a semiconductor device based on the layout.

13. A method comprising:
    assigning a first color group to a plurality of first routing tracks of the layout;
    assigning a second color group to a plurality of second routing tracks of the layout, wherein a first routing track of the plurality of first routing tracks is between adjacent second routing tracks of the plurality of second routing tracks, and each color of the second color group is different from each color of the first color group;

assigning a third color group to a plurality of third routing tracks of the layout, wherein the first routing track of the plurality of first routing tracks is between adjacent third routing tracks of the plurality of third routing tracks, and each color of the third color group is different from each color of the first color group and each color of the second color group, assigning a color from the first color group to each default element along each first routing track of the plurality of first routing tracks in a cyclical fashion;

assigning a color from the second color group to each default element along each second routing track of the plurality of second routing tracks in a cyclical fashion; and assigning a color from the third color group to each default element along each third routing track of the plurality of third routing tracks in a cyclical fashion.

14. The method of claim 13, further comprising identifying a non-default element in the layout based on a dimension of the non-default element in a first direction perpendicular to each of the plurality of first routing tracks.

15. The method of claim 14, further comprising identifying, in response to identifying the non-default, an exclusion site adjacent to the identified non-default element.

16. The method of claim 15, further comprising moving a default element at the exclusion site to a different position in the layout.

17. The method of claim 14, wherein identifying the non-default element comprises comparing a dimension of the non-default element in the first direction with a dimension of each default element in the first direction.

18. The method of claim 13, further comprising manufacturing a semiconductor based on the layout.

19. A system comprising:
a non-transitory computer readable medium configured to store instructions thereon; and
a processor connected to the non-transitory computer readable medium, wherein the processor is configured to execute the instructions for:
generating a layout based on cells from a cell library;
assigning a first color group to a first routing track of the layout;
assigning a second color group to a second routing track of the layout;
assigning the first color group to a third routing track of the layout, wherein the second routing track is between the first routing track and the third routing track;
assigning a first color from the first color group to a first conductive element along the first routing track;
assigning a second color from the first color group to a second conductive element along the first routing track; and
assigning a third color from the second color group to a third conductive element on the second routing track, wherein the third color is different from each of the first color and the second color.

20. The system of claim 19, wherein the processor is configured to execute the instructions for generating instructions for instructing manufacturing machines to manufacture a semiconductor device based on the layout.

* * * * *